United States Patent [19]
Ikeda

[11] Patent Number: 5,321,398
[45] Date of Patent: Jun. 14, 1994

[54] VARIABLE LENGTH CODER AND DATA PACKING CIRCUIT

[75] Inventor: Yasunari Ikeda, Kanagawa, Japan
[73] Assignee: Sony Corporation, Tokyo, Japan
[21] Appl. No.: 946,755
[22] Filed: Sep. 17, 1992
[30] Foreign Application Priority Data

Sep. 27, 1991 [JP] Japan .................. 3-249257
Sep. 30, 1991 [JP] Japan .................. 3-251368

[51] Int. Cl.⁵ ........................................ H03M 7/40
[52] U.S. Cl. ............................... 341/67; 341/60
[58] Field of Search ............................. 341/67, 60

[56] References Cited

U.S. PATENT DOCUMENTS

| | | | |
|---|---|---|---|
| 4,568,916 | 2/1986 | Bahgat | 341/67 |
| 4,914,675 | 4/1990 | Fedele | 341/67 |
| 4,963,867 | 10/1990 | Bertrand | 341/67 |
| 5,140,322 | 8/1992 | Sakagami | 341/67 |
| 5,162,795 | 11/1993 | Shirota | 341/67 |

Primary Examiner—Howard L. Williams
Attorney, Agent, or Firm—Limbach & Limbach

[57] ABSTRACT

A variable length coder includes a buffer memory for temporarily storing data, to be coded, a coding table for producing a variable length code and a code length thereof in response to the data supplied from the buffer memory, a shifter for shifting the variable length code according to a shift control signal, registers for storing shifted data supplied from the shifter through a gate, and a multiplexer for selectively feeding high-order or low-order bits of the data stored in the registers to the gate, and a register for accumulating code lengths from the coding table. The buffer memory, the coding table, the shifter, and the multiplexer are controlled by output data from the register.

3 Claims, 9 Drawing Sheets

Invalid Data

VARIABLE LENGTH CODER AND DATA PACKING CIRCUIT

BACKGROUND OF THE INVENTION

1. Field of the Invention

The present invention relates to a variable length coder (VLC) for use in a device which codes an image signal with high efficiency.

2. Description of the Prior Art

One conventional variable length coder will be described below with reference to FIGS. 1 and 2 of the accompanying drawings.

FIG. 1 shows, in block form, a conventional variable length coder for coding data, such as image data, having a maximum code length of 16 bits in the illustrated example.

FIG. 2 illustrates internal data status or output data of various circuit components of the variable-length coder shown in FIG. 1.

In FIG. 1, 16-bit data supplied to an input terminal INPUT is converted by a coding table 32 into a variable length code VLC which is transferred to a barrel shifter (SFT) 33. The variable length code VLC outputted from the coding table 32 has a bit length shorter than the bit length of the 16-bit data. In FIG. 2, vertically elongate rectangular frames represent data whose vertical lengths are indicative of bit numbers. For example, the variable length code VLC outputted from the coding table 32 is 16 bits, and the internal data of the barrel shifter 33 is 32 bits.

As shown in FIG. 1, the coding table 32 also outputs a code length VL of the variable length code VLC.

A shift controller (R$\phi$) 34 accumulates code lengths VL, and outputs the accumulated code lengths VL as a shift SF, which is representative of the number of bits of the data supplied to the input terminal INPUT. The shift SF can have a value of 16 at maximum. If the shift SF exceeds 16, then it is equalized to the difference between its value and 16. In the event that the shift SF is in excess of the maximum value, the shift controller 34 outputs a flag FL of "1" indicating an overflow. If the shift SF has no overflow, the shift controller 34 outputs a flag FL of "0".

The variable length code VLC transferred to the barrel shifter 33 is placed in a register in the barrel shifter 33 by the shift SF outputted from the shift controller 34, which shift SF represents the code length VL of the variable length code VLC of the preceding sample.

The data stored in the register in the barrel shifter 33 is then divided into high- and low-order 16 bits. The low-order 16 bits, denoted at BS1, are transferred through an OR gate 35 to a register (R1) 36. The high-order 16 bits, denoted at BS2, are transferred directly to a register (R2) 37. Each of the registers 36, 37 comprises a flip-flops, and holds the data transferred at a present time and outputs the held data at a next time.

The output data from the registers 36, 37 are supplied to a multiplexer (MUX) 38. The multiplexer 38 selects the output data from either the register 36 or the register 37. Specifically, when the flag FL outputted by the shift controller 34 is "1", the multiplexer 38 selects the output data from the register 36, and when the flag FL outputted by the shift controller 34 is "0", the multiplexer 38 selects the output data from the register 37.

At a time n=0, the variable length code VLC outputted from the coding table 32 is composed of data A which is valid variable length code data of 5 bits and data 0 which is invalid data.

At the time n=0, since the variable length VL of the preceding sample is 0, the internal data of the barrel shifter 33 contains the data A of the variable length code VLC starting from the LSB thereof, as shown in FIG. 2.

At the time n=0, the registers 36, 37 have internal data status R1, R2 of 0, i.e., the data stored in the registers 36, 37 are nil, as shown in FIG. 2.

At a next time n=1, it is assumed that the variable length code VLC has valid variable length code data B whose code length VL is 2 bits. At this time, the shift SF is of 5 bits which is the code length VL the data A of the variable length code VLC at the preceding time n=0. Therefore, the data in the barrel shifter 33 is shifted 5 bits such that the data B is stored in a position which corresponds to a 6th bit counted from the LSB of the data in the barrel shifter 33. The register 36 outputs the data at the preceding time n=0, and the register 37 outputs 0.

At a time n=2, it is assumed that the variable length code VLC has valid variable length code data C whose code length VL is 12 bits. At this time, the shift SF is 7 bits which are the sum of 5 and 2 bits that are the code lengths VL of the data A, B of the variable length codes VLC. The data in the barrel shifter 33 is shifted 7 bits such that the data C is stored in a position which corresponds to an 8th bit counted from the LSB of the data in the barrel shifter 33. The register 36 outputs data which is produced when the data BS1 outputted from the barrel shifter 33 and data MXO outputted from the multiplexer 38 at the preceding time are ORed. The data outputted from the register 36 is therefore the sum of the data A, B as shown in FIG. 2. The register 37 outputs 0.

At a time n=3, it is assumed that the variable length code VLC has valid variable length code data D whose code length VL is 10 bits. At this time, the shift SF is 19 bits which is the sum of the code lengths VL so far. Since the shift SF has a maximum value of 16 bits, the shift SF becomes 19−16=3 bits. Now, the shift controller 34 detects an overflow, and the flag FL is set to "1". The data outputted from the register 36 is produced by ORing the data outputted from the barrel shifter 33 so far. Inasmuch as the data C of the variable length code VLC exceeds the 16-bit range of the register 36 by 3 bits, the excess 3 bits are outputted from the register 37. At the same time, when the flag FL is set to "1", the data stored in the register 36 is stored in a buffer memory (BM) 39.

At a time n=4, the barrel shifter 33 shifts the data as shown in FIG. 2. Because the flag FL has been set to "1" at the preceding time, the data outputted from the register 36 is produced by ORing the data outputted from the register 37 at the preceding time and the data D of the variable length code VLC at the preceding time.

The aforesaid operation is subsequently repeated as shown in FIG. 2.

Heretofore, once the maximum code length of the variable length code VLC is determined, the data range of the barrel shifter 33 and the data range for the buffer memory 39 are determined. Consequently, the conventional variable length coder cannot be constructed with system flexibility.

The article "*Digital Coding of Component Television Signals for Contribution—Quality Applications in the Range 34-45 Mbits*" CMTT—2/6—E 8 March 1991 shows use of a variable length code having a maximum code length of 18 bits, and bit stuffing in units of 16 bits with 16-phase-interleave error correction. In such an application, it is desirable to code and output data in the range of 16 bits though the maximum code length is of 18 bits. However, the conventional variable length coder fails to provide such flexibility.

FIGS. 3 and 4 of the accompanying drawings show a conventional higher-speed variable length coder which is composed of two parallel variable length coders each of the structure shown in FIG. 1.

In FIG. 3, each time a predetermined number of data to be coded are supplied, they are alternately stored in FIFO memories 41, 42, and the stored data are read therefrom at a rate which is half the rate at which they have been stored. The data thus read from the FIFO memories 41, 42 are then coded by respective variable length coders 43, 44. The coded data outputted from the respective variable length coders 43, 44 are then stored in FIFO memories 45, 46, respectively, from which the stored data are alternately read as output signals at a rate twice the rate at which they have been stored.

However, since the variable length coders 43, 44 operate independently of each other, no matching can be achieved between the data outputted from each of the variable length coders 43, 44. Therefore, the coded data may contain invalid data in a region where they are joined to each other, as shown hatched in FIG. 4. When such invalid data are included, they tend to lower the efficiency with which the coded data are transmitted.

OBJECTS AND SUMMARY OF THE INVENTION

It is an object of the present invention to provide a variable length coder which allows flexible system construction for variable length coding of data.

Another object of the present invention is to provide a variable length coder which is capable of high-speed operation for variable length coding of data and permits coded data to be transmitted with high efficiency.

According to the present invention, there is provided a variable length coder comprising a buffer memory for temporarily storing data to be coded, a coding table for producing a variable length code and a code length thereof in response to the data supplied from the buffer memory, a shifter for shifting the variable length code according to a shift control signal, a gate, register means for storing shifted data supplied from the shifter through the gate, switching means for selectively feeding high-order or low-order bits of the data stored in the register means to the gate, and a register for accumulating code lengths from the coding table, the arrangement being such that the buffer memory, the coding table, the shifter, and the switching means are controlled by output data from the register.

According to the present invention, there is also provided a variable length coder comprising converting means for converting data to be coded into parallel data, a plurality of parallel circuits including respective coding tables for producing variable length codes and code lengths thereof in response to the parallel data from the converting means, and respective shifters for shifting the variable length codes, respectively, by respective shifts, a shift calculating circuit for calculating the shifts in response to the code lengths, a plurality of registers, and a plurality of gates for supplying output data from the shifters and output data from the registers therethrough to the registers.

The above and other objects, features, and advantages of the present invention will become apparent from the following description of illustrative embodiments thereof to be read in conjunction with the accompanying drawings, in which like reference numerals represent the same or similar objects.

BRIEF DESCRIPTION OF THE DRAWINGS

FIG. 6 is a diagram illustrative of the manner in which the variable length coder shown in FIG. 5 operates;

FIG. 8 is a diagram illustrative of the manner in which the variable length coder shown in FIG. 7 operates.

DETAILED DESCRIPTION OF THE PREFERRED EMBODIMENTS

Figure 5:
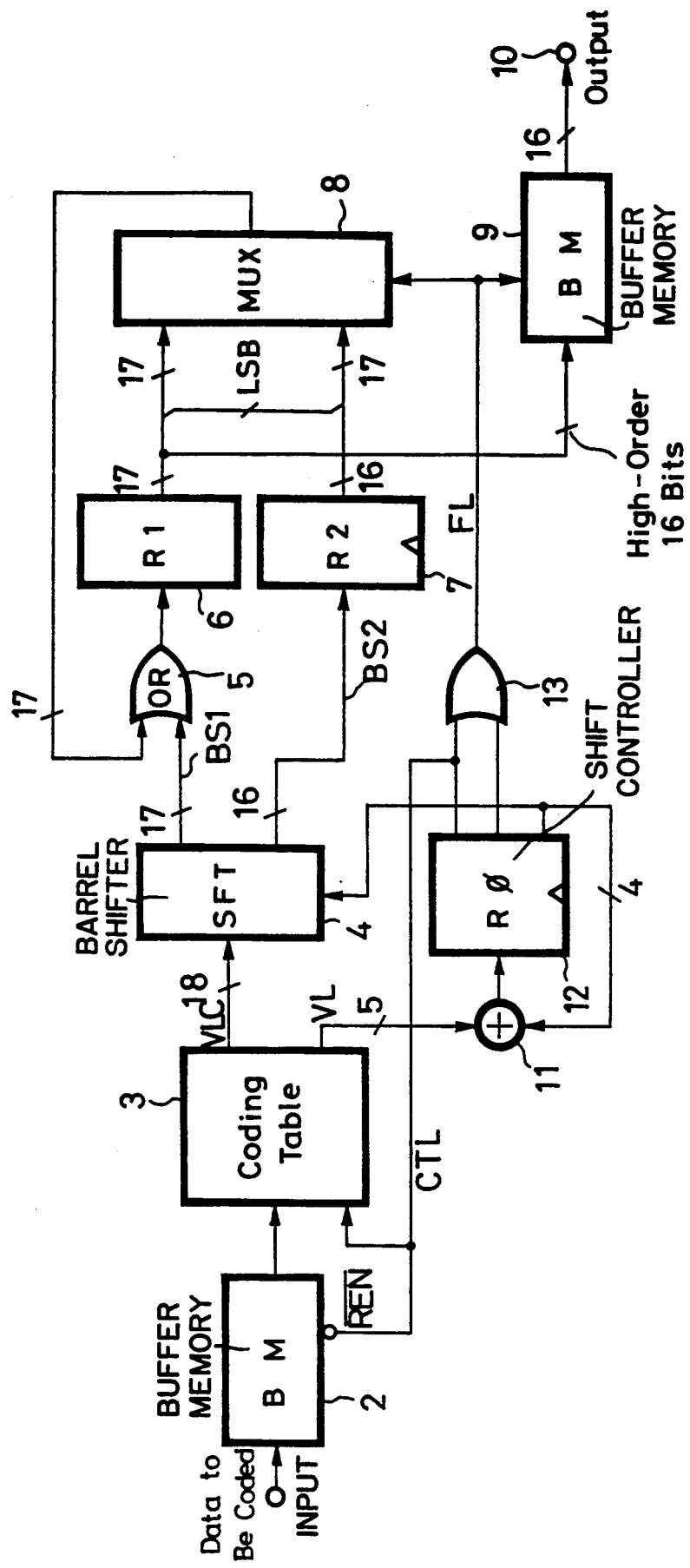
FIG. 5 is a block diagram of a variable length coder according to an embodiment of the present invention.
Figure 6:
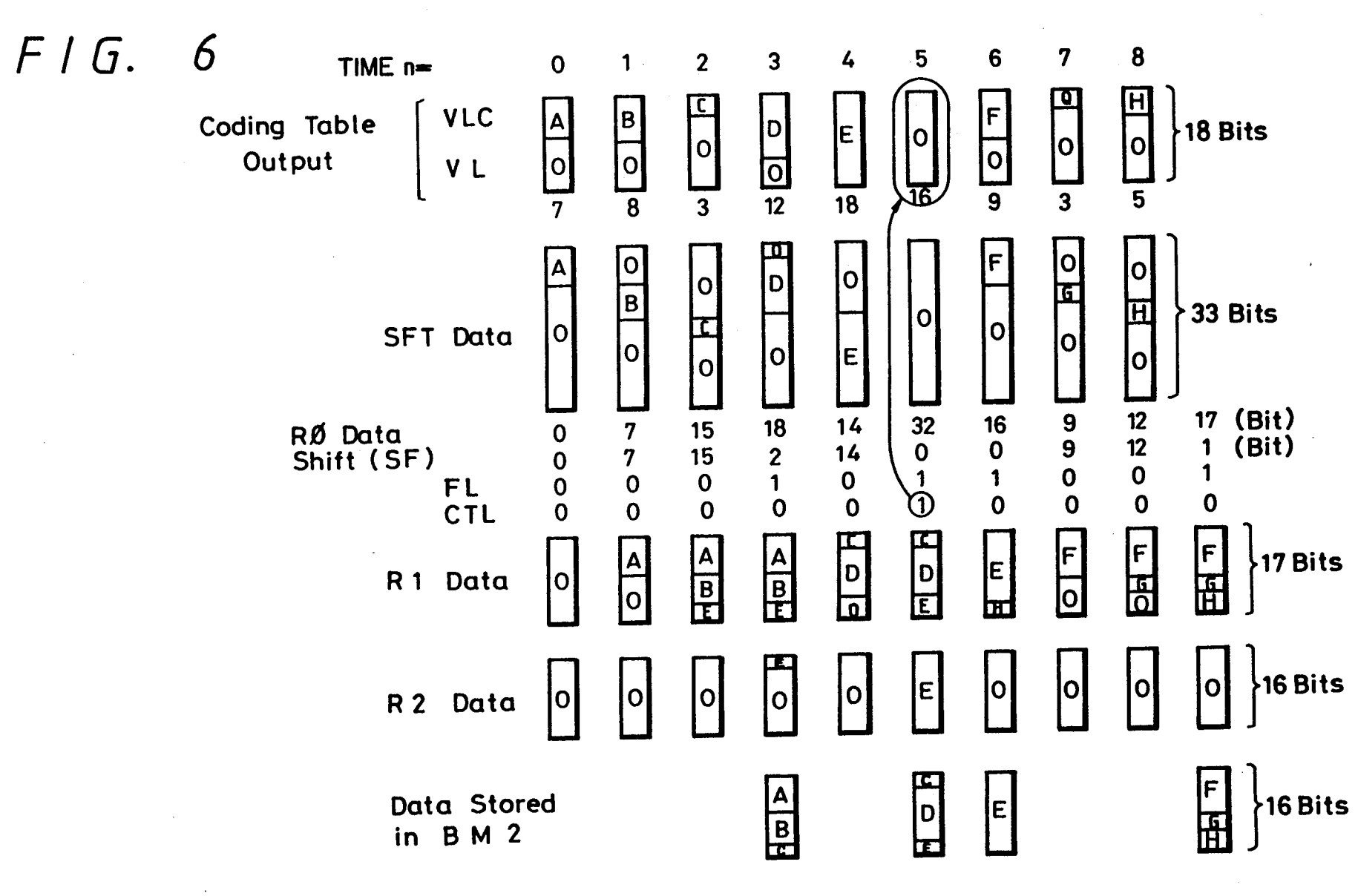

FIGS. 5 and 6 show a variable length coder according to an embodiment of the present invention, for outputting a variable length code whose maximum code length is 18 bits for 16 bit input date.

Data to be coded, which is supplied to an input terminal INPUT is delivered through a buffer memory (BM) 2 to a coding table 3 in the form of a ROM. The coding table 3 stores variable length codes and their code lengths. The data supplied to the coding table 3 is converted thereby into a variable length code VLC which is then supplied to a barrel shifter (SFT) 4 having a data range of 33 bits. The barrel shifter 4 outputs 33-bit data, and high-order 17 bits of the 33-bit data outputted from the barrel shifter 4 are supplied through an OR gate 5 to a register (R1) 6, and low-order 16 bits are supplied directly to a register (R2) 7.

The 17-bit output data from the register 6 is supplied to a multiplexer (MUX) 8. The multiplexer 8 is also supplied with 17-bit data which is the combination of the 16-bit output data from the register 7 and the LSB of the 17-bit output data from the register 6, the LSB being added next to the high-order position, i.e., the MSB of the 16-bit output data from the register 7. The multiplexer 8 alternately feeds the supplied 17-bit data back to the OR gate 5. Therefore, the OR gate 5 successively combines variable length codes that are generated by the coding table 3. When the data of 16 bits or more are stored in the registers 6, 7, high-order 16 bits of the data from the register 6 are stored in a rate-smoothing output buffer memory (BM) 9. The multiplexer 8 selects the output data from the register 7 so that the low-order data other than the high-order 16 bits of the data from the register 6 is fed back to the OR gate 5. In this manner, the data supplied to the input terminal are successively coded and outputted from an output terminal 10 connected to the buffer memory 9.

The above coding operation is controlled by the o status of data stored in a register (Rφ) 12 which accumulates code lengths VL outputted from the coding table 3 through an adder 11. As described above, each time the data of 16 bits or more are stored in the registers 6, 7, the high-order 16 bits of the data from the register 6 are stored in the buffer memory 9. When it is detected that the data stored in the register 12 is 16 bits or more, the register 12 controls the multiplexer 8 and the buffer memory 9 with a flag FL of "1" produced by an OR gate 13 which ORs high-order 2 bits of the data in the register 12.

The barrel shifter 4 is controlled using low-order 4 bits of the data stored in the register 12. The register 12 accumulates code lengths when it is supplied with the sum of the low-order 4 bits of the data stored in the register 12 and the code length outputted from the coding table 3. Therefore, if the data stored in the register 12 is 14 bits and the code length outputted from the coding table 3 is 18 bits, as at a time n=4 (FIG. 6), the data stored in the register 12 at a next time n=5 is 32 bits.

When the data stored in the register 12 is of 32 bits or more, even if the data of high-order 16 bits stored in the registers 6, 7 are delivered to the buffer memory 9, data of 16 bits or more remain stored in the registers 6, 7. This would impose a problem at the time of combining next data from the barrel shifter 4 with the OR gate 5. According to the present invention, the MSB of the data stored in the register 12 is monitored, and when the data stored in the register 12 is 32 bits or more, the data to be coded which is supplied from the buffer memory 2 is interrupted. The coding table 3 then outputs dummy data whose 18 bits are all "0" as a variable length code VLC and also outputs data of 16 bits as a code length VL.

Specifically, as shown in FIG. 6 at the time n=5, the data stored in the register 12 is of 32 bits, and the register 12 produces a control signal CTL of "1" (see FIG. 5). The control signal CTL is supplied to a read interrupt terminal (REN) of the buffer memory 2, which interrupt the transfer of data to the coding table 3. The control signal CTL is also applied to the coding table 3 to cause the coding table 3 to output the 16-bit dummy data as a variable length code VLC.

The 16 bits of the data of 16bits or more which remain stored the registers 6, 7 are once again stored in the buffer memory 9. As a result, the data which is fed through the multiplexer 8 back to the OR gate 5 and remains stored in the registers 6, 7 are of 0 or 1 bit. Thereafter, the data to be coded are read from the buffer memory 2 and supplied to the coding table 3 which successively produce variable length codes.

In the above variable length coder, the barrel shifter 4 may be of a reduced data range, and hence may be of a relatively small circuit scale. The variable length coder may be flexible in system construction as its output data may be in any desired range.

In the above embodiment, the maximum code length is 18 bits. However, the variable length coder may code data having a maximum code length other than 18 bits. For example, if the maximum,, code length is 20 bits, then the barrel shifter 4 has a data range of 35 bits. High-order 19 bits of the data in the barrel shifter 4 are supplied through the OR gate 5 to the register 6, and low-order 16 bits of the data in the barrel shifter 4 are supplied directly to the register 7. High-order 19 bits or low-order 19 bits of the 35-bit data stored in the registers 6, 7 are selected by the multiplexer 8, and fed back to the OR gate 5 to combine with a next variable length code. The buffer memory 2, the coding table 3, the barrel shifter 4, the multiplexer 8, and the buffer memory 9 are controlled in the same manner as described above with reference to FIGS. 5 and 6.

Figure 7:
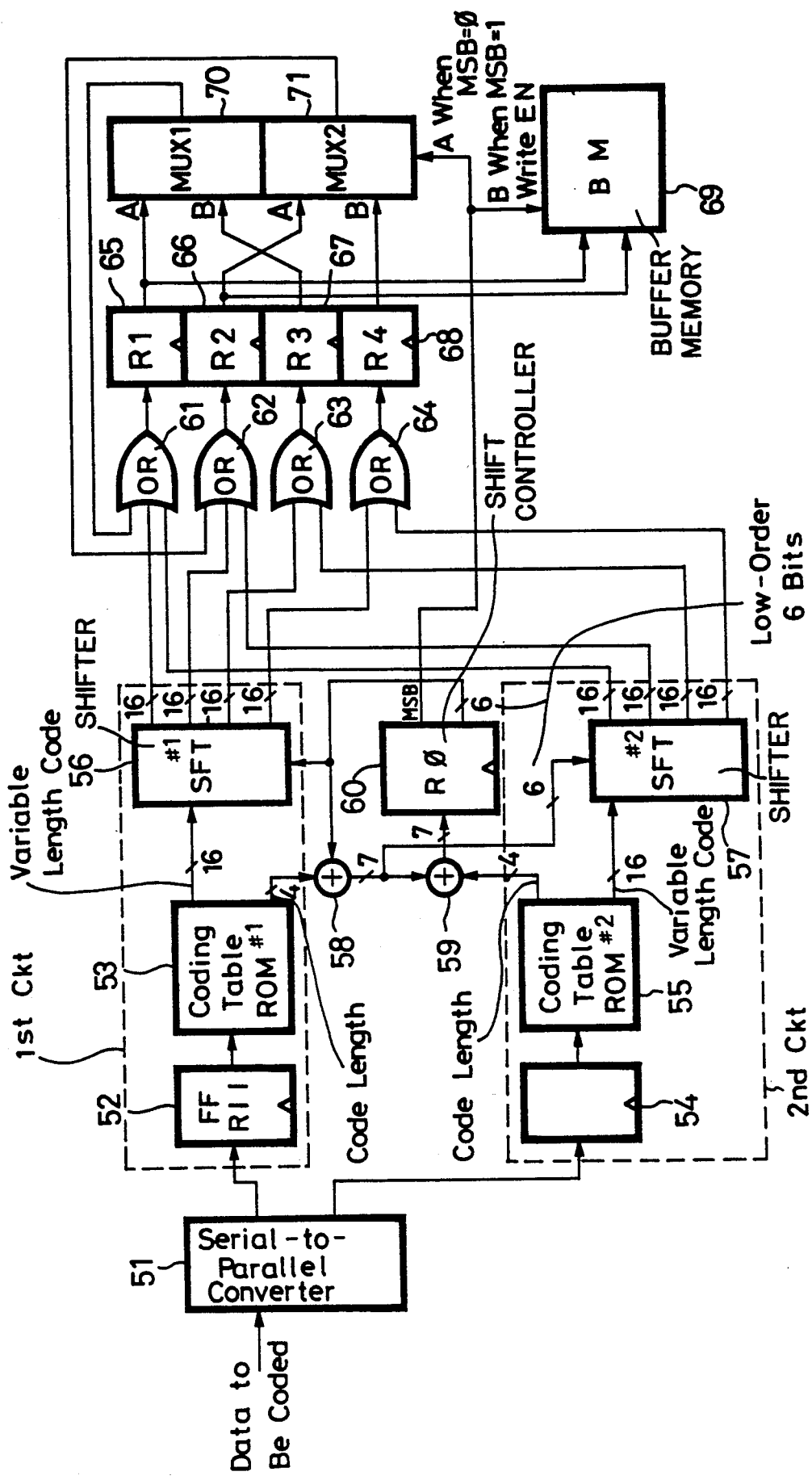
FIG. 7 is a block diagram of a variable length coder according to another embodiment of the present invention.
Figure 8:
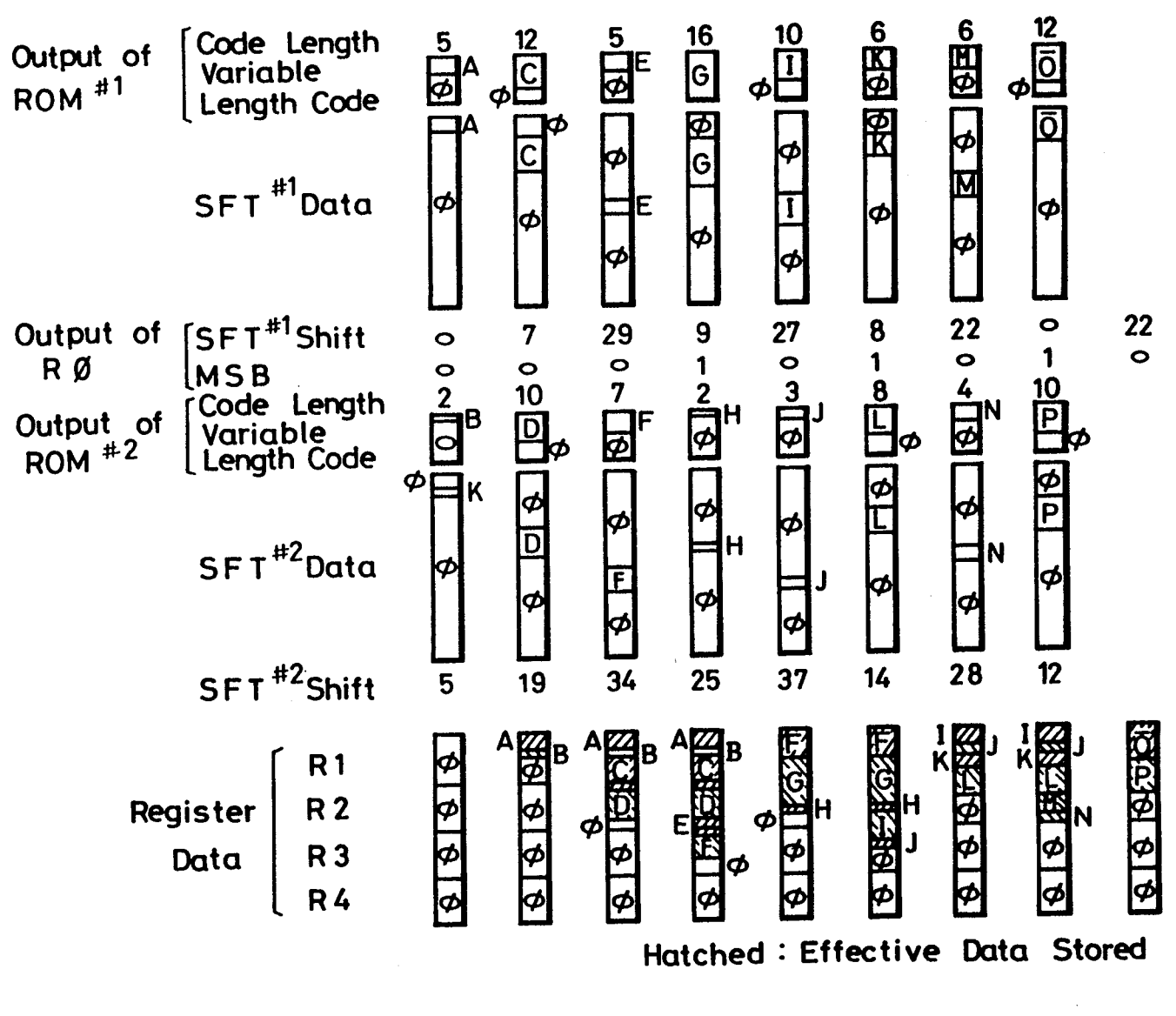

FIGS. 7 and 8 show a variable length coder according to another embodiment of the present invention. Data to be coded is converted by a serial-to-parallel converter 51 into two parallel data signals which are applied to respective coding tables 53, 55 through respective registers 52, 54 in first and second circuits. Each of the coding tables 53, 55 stores variable length codes and their code lengths. In response to the supplied data signals, the coding tables 53, 55 output variable length codes which are supplied respectively to shifters 56, 57, and also output code lengths which will be used to calculate shifts.

More specifically, the code lengths from the coding tables 53, 55 in the first and second circuits are added by adders 58, 59 and the sums are accumulated by a register 60. The register 60 outputs a signal for controlling the shift by which the variable length code is to be shifted by the shifter 56 in the first circuit. The shift by which the variable length code is to be shifted by the shifter 57 in the second circuit is controlled by the sum of the output signal of the register 60 and the code length outputted from the coding table 53 in the first circuit. Therefore, the shift in the shifter 57 is always offset with respect to the shift in the shifter 56, i.e., greater than the shift in the shifter 56 by the code length in the first circuit. Accordingly, when shifted output data from the shifters 56, 57 in the first and second circuits are combined by OR gates 61, 62, 63, 64, the variable length codes from the first and second circuits are neatly successively joined to each other.

In the variable length coder shown in FIGS. 7 and 8, therefore, the shifters 56, 57 are controlled so that the variable codes of the two parallel data are neatly successively joined to each other. The shifted output data from the shifters 56, 57 are combined by the OR gates 61, 62, 63, 64 with output data from registers 65, 66, 67, 68 which store preceding output data from the shifters 56, 57, and the combined data are then supplied to the registers 65 ~ 68.

When the variable length code effective for the registers 65~68 is 32 bits or more, i.e., when the registers 65, 66 become full, their data are stored in a buffer memory 69, and the data from the registers 65~68 are switched over, i.e., the data from the registers 67, 68 are now fed by multiplexers 70, 71 back to the OR gates 61, 62.

The shifters 56, 57 are required to be controlled to correct their shifts upon switching between the data from the registers 65~68, with a resulting correction of the accumulated code lengths upon such switching. In this embodiment, the 32-bit data is stored in the buffer memory 69 and the feedback loops from the registers 65~68 to the OR gates 61~64 are switched over under the control of the MSB of the accumulated code lengths stored in the register 60. In calculating next shifts, low-order bits other than this MSB are added to a next code length, and the sums are accumulated for the correction of the shifts.

Figure 1:
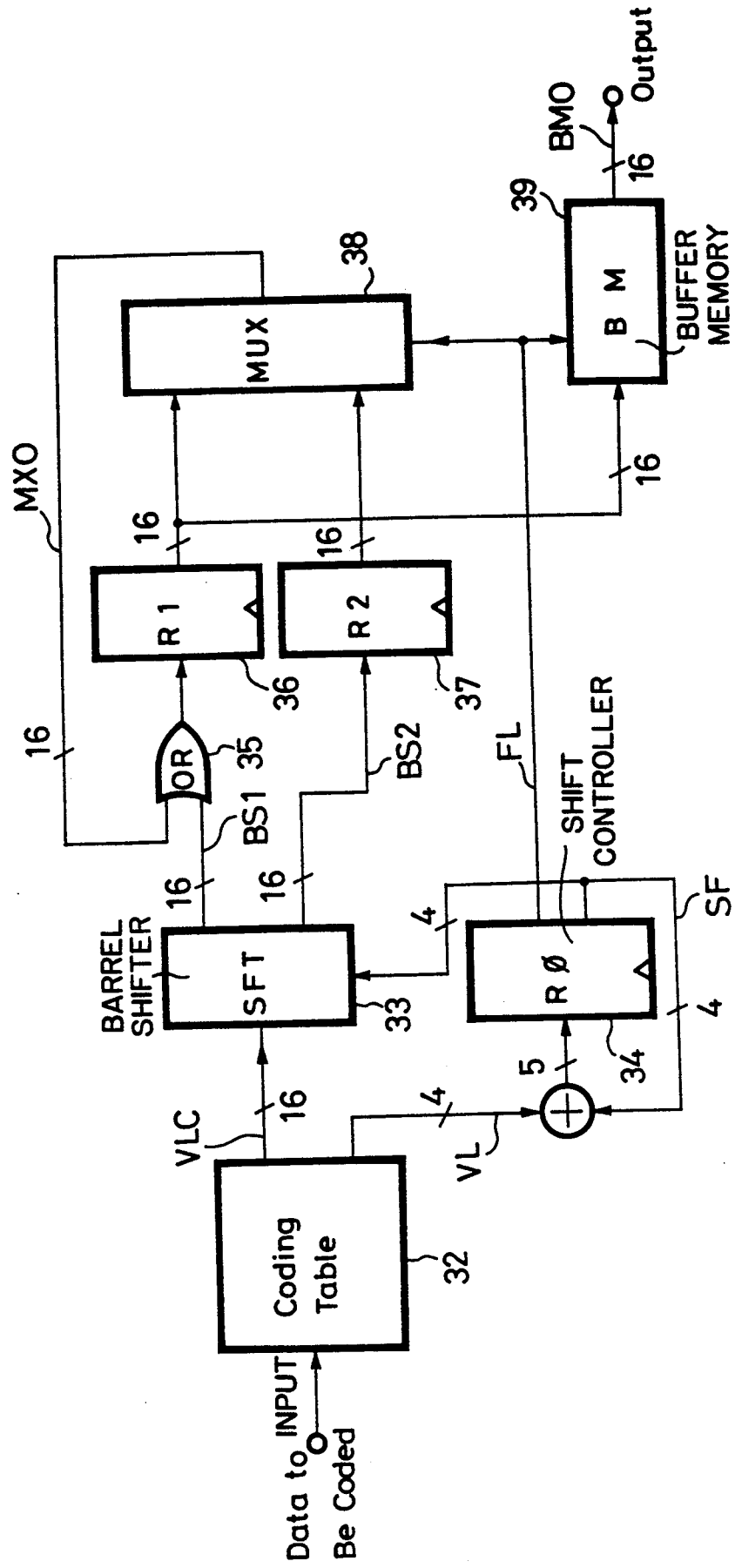
FIG. 1 is a block diagram of a conventional variable length coder.
Figure 2:
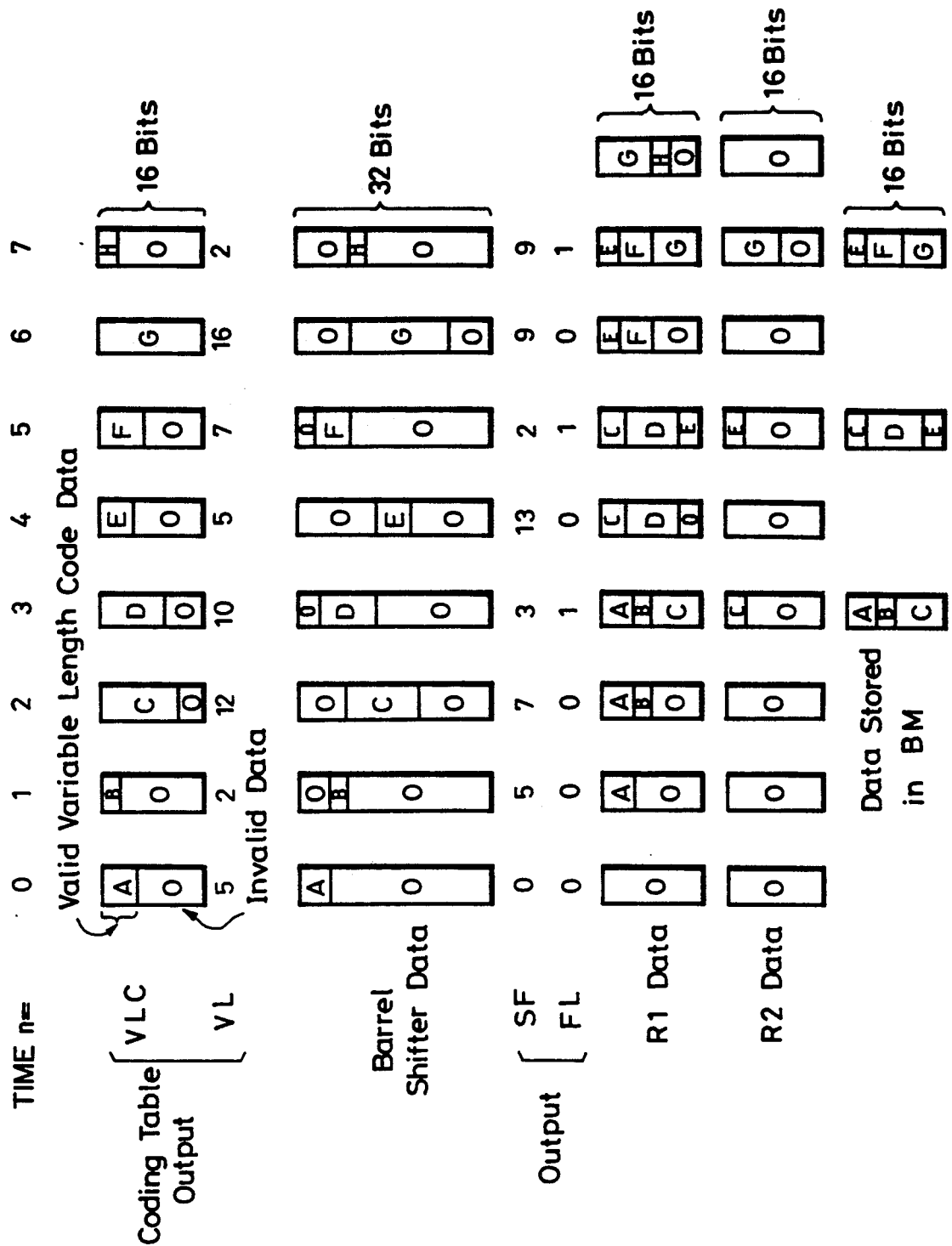
FIG. 2 is a diagram illustrative of the manner in which the variable length coder shown in FIG. 1 operates.
Figure 3:
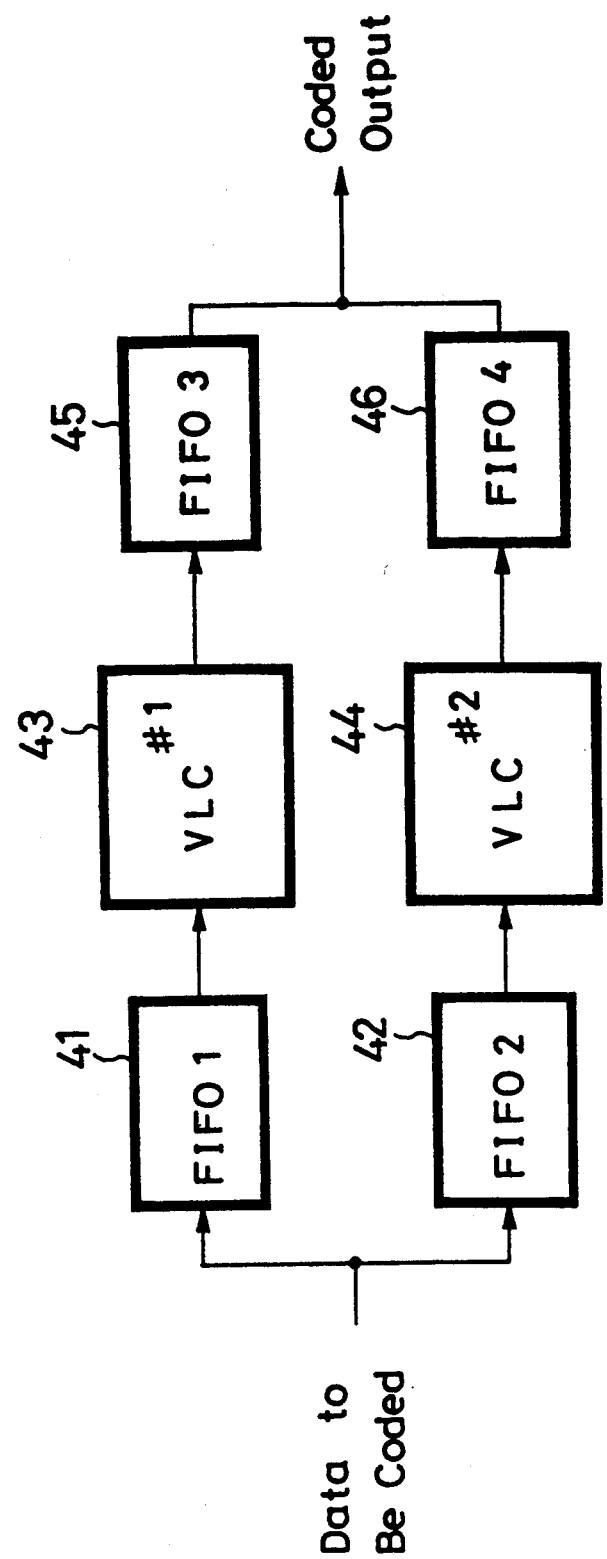
FIG. 3 is a block diagram of another conventional variable length coder.
Figure 4:
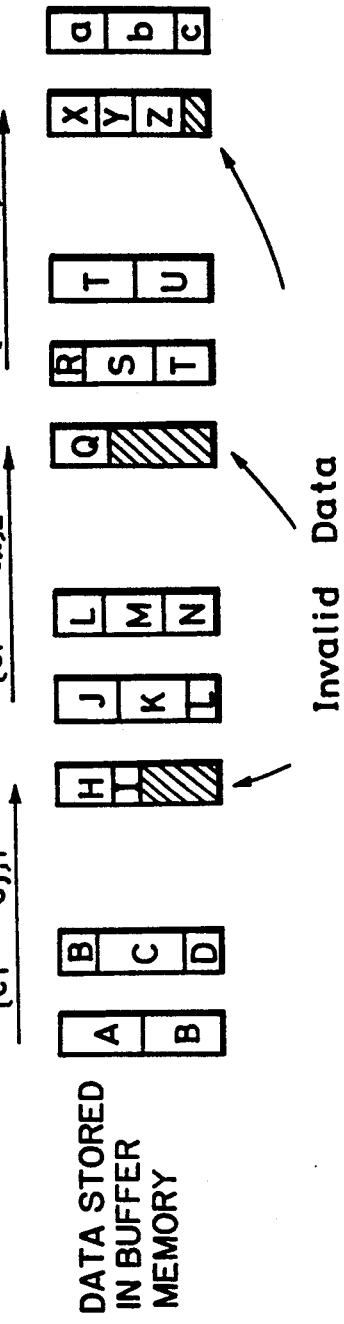
FIG. 4 is a diagram illustrative of the manner in which the variable length coder shown in FIG. 3 operates.

The circuit components following the serial-to-parallel converter 51 in FIG. 7 operate at a rate which is half the rate at which the data to be coded is supplied to the serial-to-parallel converter 51. Therefore, the variable length coder shown in FIGS. 7 and 8 can process data to be coded which is supplied at a rate that is twice the rate at which the data is supplied in the conventional variable length coders. In the conventional variable length coder shown in FIGS. 3 and 4, invalid data tends to be inserted between variable length codes. The variable length coder shown in FIGS. 7 and 8 is arranged, on principle, not to allow such invalid data to be inserted, and is therefore free of reductions in the data transmission efficiency. Consequently, the variable length coder shown in FIGS. 7 and 8 is capable of outputting variable length codes at high speed without insertion of invalid data.

Figure 9:
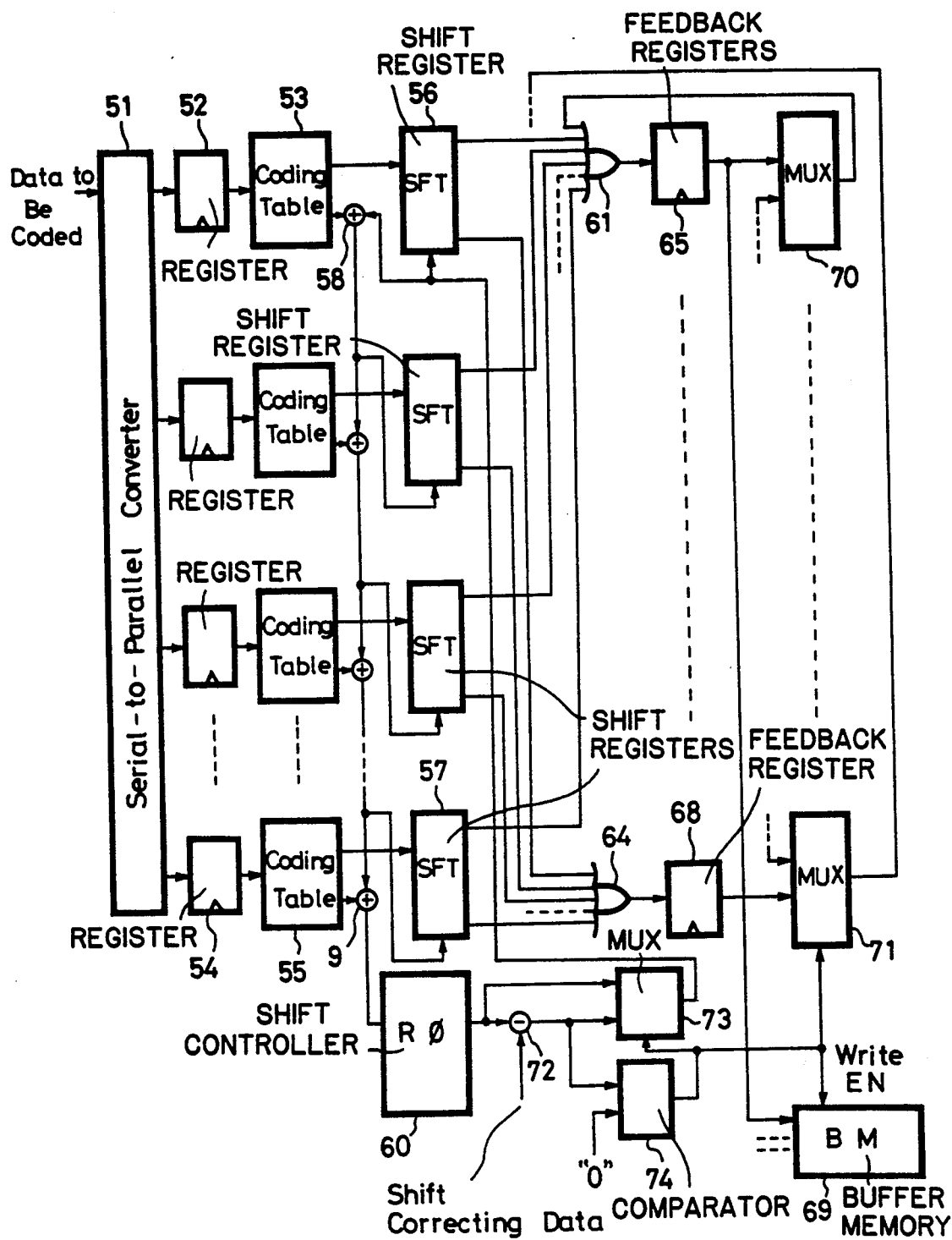
FIG. 9 is a block diagram of a general arrangement of variable length coder according to the present invention.

In FIGS. 7 and 8, the variable length coder is composed of two parallel circuits. Generally, a variable length coder may comprise n parallel circuits, as shown in FIG. 9. Specifically, a variable length coder may comprise n shifters for shifting variable length codes by shifts which are 2n times the maximum code length thereof, and a number of registers which is 2n times the maximum code length, for feeding stored data back to the OR gates. When the size of effective data becomes ½ or more of the capacity of these registers, the data is supplied to the buffer memory, and the registers are switched over. A serial-to-parallel converter converts supplied data to be coded into n variable length codes which are neatly joined to each other by the OR gates. As shown in FIG. 9, the shifter in the first circuit among the n parallel circuit is controlled by output data from a multiplexer 73 which selects either output data of the register that accumulates the sums of code lengths from the coding tables or output data from a subtracter 72 that subtracts a fixed quantity from the register output data for correcting shifts upon switching between the feedback registers 65~68. The shifter in the kth circuit among the n circuits is controlled by the sum of the shift in the first circuit and the code lengths up to the (k−1)th circuit.

In FIGS. 7 and 8, the shifts can easily be corrected by omitting the MSB of the data in the register 60 because the shifts are corrected by 64 bits. Generally, however, the variable length coder should have a shift corrector composed of the subtracter 72, the multiplexer 73, and a comparator 74, as shown in FIG. 9. When output data from the shift corrector is 0 or more, the output data from the register 65 is stored in the buffer memory 69, the feedback registers are switched over, and the shift in the shifter in the first circuit is controlled by the output data from the shift corrector.

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A variable length coder comprising:
   a buffer memory for temporarily storing data to be coded and responsive to a first control signal;
   a coding table coupled to an output of the buffer memory for producing a variable length code and a code length thereof in response to the data supplied from said buffer memory and responsive to the first control signal;
   a shifter coupled to an output of the coding table for shifting the variable length code according to a second control signal;
   a first gate;
   a first register coupled to an output of the first gate and to the shifter for storing the variable length code, wherein high-order bits of the variable length code are supplied from said shifter through said first gate and low-order bits of the variable length code are supplied directly from said shifter;
   a multiplexer for selectively feeding either high-order bits or low-order bits from said first register to said first gate and responsive to a third control signal;
   a second register for generating a data value which is the sum of said code length from said coding table and low-order bits from said second register, wherein said low-order bits comprise said second control signal, and wherein a most significant bit of the second register comprises the first control signal; and
   a second gate coupled to most significant bit and a next most significant bit of the second register for generating said third control signal
   wherein if the first control signal is true then data from the buffer memory is inhibited from passing to the coding table and the coding table generates a dummy variable length code.

2. A variable length coder, comprising:
   converting means for converting data to be coded into parallel data;
   a plurality of parallel circuits coupled to the converting means, each of said parallel circuits comprising:
      a coding table for producing a variable length code and a code length thereof in response to the data supplied from said converting means; and
      a shifter for shifting said variable length code according to a respective shift control signal;
   a shift calculating circuit coupled to the parallel circuits for calculating respective shift control signals as a function of said code lengths;
   a plurality of gates each coupled to a corresponding portion of bits from each shifter;
   first register means coupled to said gates for storing the variable length codes; and
   a multiplexer for selectively feeding the variable length codes from said first register means to one or more of said gates.

3. A variable length coder according to claim 2, further including a buffer memory and switching means for selectively feeding the output data from said first register means back to said gates, wherein said shift calculating circuit comprises a register for accumulating sums of code lengths from the coding tables in said parallel circuits, and a subtracter for subtracting a fixed quantity from output data from said first register means for correcting the shifts, the arrangement being such that when output data from said subtracter is negative, the output data from said register is used to control the shift in the shifter in a first one of said parallel circuits, that when output data from said subtracter is 0 or more, the output data from said subtracter is used to control the shift in the shifter in said first one of the parallel circuits, and the sum of the output data from said subtracter and the code length up to an (R−1)th one of said parallel circuits is used to control the shift in the shifter in an Rth one of said parallel circuits, and that when output data from said subtracter is 0 or more, output data from said first register means is stored in said buffer memory, and said switching means is activated to switch over said first register means for feeding the output data therefrom back to said gates.

* * * * *